United States Patent
Kyriakos et al.

(10) Patent No.: US 6,680,610 B1
(45) Date of Patent: Jan. 20, 2004

(54) APPARATUS AND METHOD FOR PARALLEL MR DATA ACQUISITION AND PARALLEL IMAGE RECONSTRUCTION FROM MULTIPLE RECEIVER COIL ARRAYS FOR FAST MRI

(76) Inventors: Walid E. Kyriakos, 7 Euston St., Apt. #4, Brookline, MA (US) 02446; Daniel F. Kacher, 58 Ridgemont St., Apt. #2, Allston, MA (US) 02134

( * ) Notice: Subject to any disclaimer, the term of this patent is extended or adjusted under 35 U.S.C. 154(b) by 0 days.

(21) Appl. No.: 09/577,740

(22) Filed: May 23, 2000

Related U.S. Application Data

(60) Provisional application No. 60/135,645, filed on May 24, 1999.

(51) Int. Cl.⁷ .................................................. G01V 3/00
(52) U.S. Cl. ....................... 324/307; 324/314; 324/309
(58) Field of Search ................................ 324/314, 312, 324/309, 307, 318, 300; 600/410

(56) References Cited

U.S. PATENT DOCUMENTS

| | | | |
|---|---|---|---|
| 5,587,656 A | 12/1996 | Van Heels-Bergen et al. | 324/307 |
| 5,712,567 A | 1/1998 | Wang | 324/307 |
| 5,759,152 A | 6/1998 | Felmlee et al. | 600/410 |
| 5,910,728 A * | 6/1999 | Sodickson et al. | 324/309 |
| 5,945,826 A | 8/1999 | Leussler | 324/309 |
| 6,326,786 B1 * | 12/2001 | Prussmann et al. | 324/312 |

FOREIGN PATENT DOCUMENTS

| | | | |
|---|---|---|---|
| EP | 0 271 123 A1 | 6/1988 | G01N/24/08 |

OTHER PUBLICATIONS

Pruessmann et al, Sensitivity Encoding for Fast MRI, Magnetic Resonance in Medicine 42:952–962 (1999).*

USPTO, International Search Report in PCT/US00/14171, the PCT application corresponding to the above identified application, Jul. 19, 2000.

USPTO, International Preliminary Examination Report in PCT/US00/14171, the PCT application corresponding to the above identified application, Mar. 20, 2002.

* cited by examiner

Primary Examiner—Edward Lefkowitz
Assistant Examiner—Brij B. Shrivastav
(74) Attorney, Agent, or Firm—Edward W. Porter

(57) ABSTRACT

An apparatus and method for decreasing image acquisition and reconstruction times in magnetic resonance imaging are provided. Magnetic resonance data is acquired in parallel by an array of separate RF receiver coils disposed at generally circumferentially-spaced locations relative to one another around the imaging volume defined by the body coil of a magnetic resonance imaging apparatus. Further, the image reconstruction also is performed in parallel, thereby shortening up image display times. The apparatus and method operate on the basis of determining an estimate of the sensitivity profile of each RF coil in the array, and thereafter, utilizing those profiles in the creation of a desired image by encoding later acquired magnetic resonance data from a body of interest disposed in the imaging volume of the magnetic resonance imaging apparatus. An apparatus and a method for refining the initial calibration estimate of the sensitivity profile of each of the various RF coils in the array according to the load applied thereto by the object being imaged also are provided.

23 Claims, 10 Drawing Sheets

| Coil #1 | | |
|---|---|---|
| $w_1(1,1)$ | $w_1(1,2)$ | $w_1(1,3)$ |
| $w_1(2,1)$ | $w_1(2,2)$ | $w_1(2,3)$ |
| $w_1(3,1)$ | $w_1(3,2)$ | $w_1(3,3)$ |

FIG. 4A

| Coil #2 | | |
|---|---|---|
| $w_2(1,1)$ | $w_2(1,2)$ | $w_2(1,3)$ |
| $w_2(2,1)$ | $w_2(2,2)$ | $w_2(2,3)$ |
| $w_2(3,1)$ | $w_2(3,2)$ | $w_2(3,3)$ |

FIG. 4B

| Coil #3 | | |
|---|---|---|
| $w_3(1,1)$ | $w_3(1,2)$ | $w_3(1,3)$ |
| $w_3(2,1)$ | $w_3(2,2)$ | $w_3(2,3)$ |
| $w_3(3,1)$ | $w_3(3,2)$ | $w_3(3,3)$ |

FIG. 4C

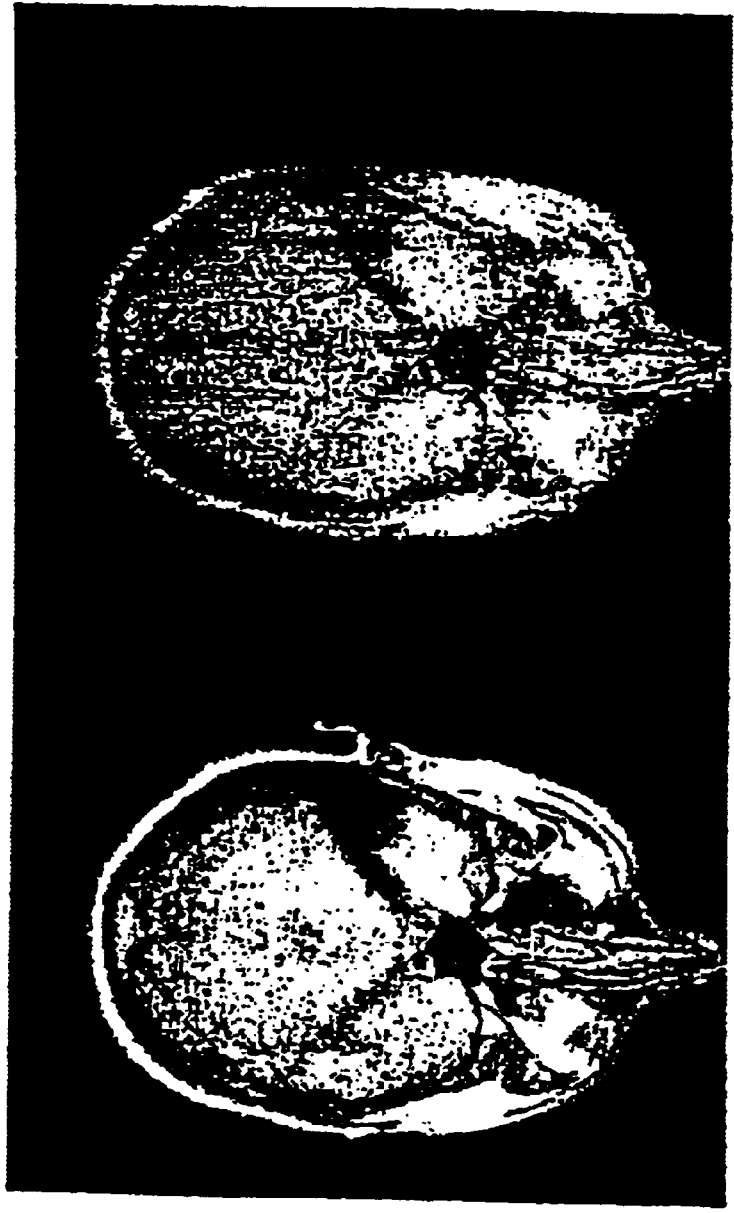

APPARATUS AND METHOD FOR PARALLEL MR DATA ACQUISITION AND PARALLEL IMAGE RECONSTRUCTION FROM MULTIPLE RECEIVER COIL ARRAYS FOR FAST MRI

RELATED APPLICATIONS

This application claims the benefit of priority of U.S. Provisional Patent Application Ser. No. 60/135,645, filed May 24, 1999, and entitled "APPARATUS AND METHOD FOR PARALLEL MR DATA ACQUISITION AND PARALLEL IMAGE RECONSTRUCTION FROM MULTIPLE RECEIVER COIL ARRAYS FOR FAST MRI", the subject matter of which is hereby incorporated by reference herein.

FIELD OF THE INVENTION

The present invention pertains to an apparatus and methods for magnetic resonance imaging, also known as magnetic resonance imaging (MRI) and, in particular, to an apparatus and methods for nuclear magnetic resonance imaging (NMRI) for decreasing magnetic resonance (MR) data acquisition times, wherein magnetic resonance data is acquired in parallel using an array of receiver coils at least partially surrounding the object of interest, and the desired MRI image is then reconstructed in parallel.

BACKGROUND OF THE INVENTION

In dynamic MRI applications, such as functional imaging, interventional imaging and cardiac imaging, there has long been a need in the art for methods and apparatus that provide high quality (e.g., high-resolution and signal-to-noise ratio) images. Conventional MRI imaging apparatus and methods, however, operate at speeds that are an order of magnitude slower than those which are currently deemed to be desirable. Some of these conventional methods are described in the Background section of U.S. Pat. No. 5,365,172 to Hrovat et al. for "Methods and Apparatus for MRI", the disclosure of which is hereby incorporated by reference herein.

In an attempt to attain faster operating speeds, several so-called "parallel" encoding apparatus combinations and/or methods have been developed. These apparatus combinations and/or methods rely on the use of multiple receiver coils for the acquisition of magnetic resonance data and high-speed data processors for the reconstruction of the field of view with significantly smaller data sets.

Among the parallel imaging techniques described in the literature, the work of Kwiat et al. ("A Decoupled Coil Detector Array for Fast Image Acquisition in Magnetic Resonance Imaging", *Medical Physics*, 18:251, 1991, the disclosure of which is hereby incorporated by reference herein) is significant. This work involved the investigation of methods for solving the inverse source problem on magnetic resonance signals received in multiple RF receiver coils. The technique proposed required the use of a number of RF coils equal to the number of pixels in the desired image. It also required that the sensitivity of the coils used be increased by an order of magnitude. Since these requirements are quite impractical in conventional magnetic resonance imaging (wherein the usual number of pixels in the image is on the order of 256×256), this technique has never been used successfully in a biological imaging experiment.

Other so-called "parallel" imaging techniques that use one dimensional sensitivity profiles of RF coils to encode space in a MRI context also have been proposed. For example, Ra, et al. ("Fast Imaging Using Sub-encoding Data Sets From Multiple Detectors", *Magn. Reson. Med.*, 30:142, 1993, the disclosure of which is hereby incorporated by reference herein), describes a method that uses sets of equally spaced k-space lines from multiple receiver coils in a line, and combines them with the one dimensional sensitivity profile information to remove the aliasing that occurs due to undersampling. A four-fold decrease in the image acquisition time of a water phantom was postulated to be possible by using an array of four coils.

Nevertheless, no biological images were shown in this article. It is believed that this may be indicative of a possible lack of robustness of the alaising removal algorithm in practical situations.

A method called SMASH proposed by Sodickson et al. ("Simultaneous Acquisition Of Spatial Harmonics (SMASH): Fast Imaging With Radio Frequency Coil Arrays", *Magn. Reson. Med.*, 38:591–603, 1997, the disclosure of which is hereby incorporated by reference herein) has been found to be practical, and yielded good results. SMASH enhances imaging speed by using multiple RF receiver coils. More specifically, it uses linear combinations of the 1D sensitivity profiles of receiver coils (weighted so as to form sinusoidal harmonics) of a one dimensional array to generate all k-space lines from a small subset of collected magnetic resonance data.

The SMASH method, however, is somewhat limited. It has an inherent inflexibility in the choice of the imaging plane to be viewed. Also, it has a demonstrable limitation in depth penetration. Further, there is a practical, physical limit on the number of coils that can be placed along one direction in a magnetic resonance imaging apparatus—particularly if the coils are to be de-coupled from one another.

SUMMARY OF THE INVENTION

The present invention provides an apparatus and a method that significantly decrease both magnetic resonance data acquisition time, and image reconstruction time, in magnetic resonance imaging.

Also, the present invention provides an apparatus and a method wherein sets of magnetic resonance information are acquired simultaneously, in parallel, with one another, and the elements of those sets preferably are subsequently processed in parallel with one another to reconstruct images.

These, and other, features and advantages of the present invention constitute a generalization of, and an improvement upon, the SMASH apparatus and method. More specifically, the present invention contemplates the placement of an array of RF coils, comprising substantially any number of RF receiver coils, at least partially around an object of interest located in the imaging volume of a magnetic imaging device. The present invention also contemplates the provision of a so-called "parallel" imaging capability wherein the output image may be taken in any plane transverse to the imaging volume of the apparatus.

In the present invention, parallel encoding in MRI is achieved by using the sensitivity profiles of an array of RF receiver coils at least partially surrounding the object of interest. Given this fact, the equation describing the MR signal seen by the $i^{th}$ coil of a coil array surrounding the imaging volume of a magnetic resonance imaging device can be written as:

$$S_i(t) = \int\int \rho(x,y) \cdot W_i(x,y) \cdot e^{j\gamma(G_x xt + G_y yt)} dx\,dy$$

Where $W_i(x,y)$ represents the 2D sensitivity profile of the $i^{th}$ coil of the array, and $\rho(x, y)$ is an image slice in a selected (x, y) plane. Then, taking the Fourier transform of that signal with respect to x yields:

$$F_i(x)=FT[S_i(t)]=\int \rho(x,y).W_i(x,y).e^{j\gamma G_y \tau}.dy$$

The latter equation represents a projection of the phase modulated image ρ(x,y) onto the x-axis. Further, this signal can be represented in discrete form by the following matrix product:

$$F_i(x)=\Sigma_y[W_i(x,y).e^{j\gamma G_y \tau}].[\rho(x,y)]$$

If the number of receiver coils used simultaneously is N, and the 2D sensitivity profile $W_i(x,y)$ of each one of them is known, it is possible to reconstruct the image from only one $N^{th}$ of the total number of k-space lines that would normally be required. Accordingly, the apparatus and method of the present invention use phase modulated projections of the received magnetic resonance data onto the frequency encoded (x-) axis, weighted by the 2D sensitivity profiles of the coils in the array, in order to reconstruct ρ(x,y) column by column (i.e., orthogonal to the x-axis).

The 2D sensitivity profiles are calculated first by acquiring a baseline image using the RF body coil of the conventional magnetic resonance imaging apparatus, whereby the sensitivity profile may be considered to be constant ($W_B$(x, y)=1) and a slice of the image in the (x, y) plane may be written as: ρ(x,y). An image is then acquired with each coil in the array. In the $i^{th}$ coil, this image can be written as:

$$W_i(x,y)\rho(x,y)$$

$W_i$(x,y) is then computed by forming a point-by-point ratio between magnetic resonance data from the $i^{th}$ coil and that from the body coil.

It, therefore, will be seen that a preferred embodiment of the invention is a method for generating a magnetic resonance image of an object of interest composed of a plurality of adjacent image lines. The method generally includes the following steps. First, a magnetic resonance imaging device is provided. This device typically includes a magnet system providing a background magnetic field in an imaging volume, a central processor, a memory device, a RF coil surrounding the imaging volume, and a plurality of radio frequency receiver coils defining a multi-dimensional array thereof disposed about the imaging volume. A two-dimensional sensitivity profile for each receiver coil in the multi-dimensional array is then computed and recorded to the memory device. Thereafter, a plurality of magnetic resonance signals of the object of interest located within the imaging volume is acquired from each receiver coil and recorded to the memory device. An image of the object of interest in a desired plane extending transversely through the imaging volume of the magnetic resonance imaging device then is reconstructed line-by line by the central processor. This reconstruction combines the inverse of the matrix of the sensitivity profiles of each receiver coil and the matrix of the recorded MR data signals together to provide an image that may be displayed or printed.

Preferably, the method of the invention involves a calibration step wherein a homogeneous water phantom is provided to obtain the sensitivity profile of each receiver in the array. The homogeneous water phantom is located in the image volume of the magnetic resonance imaging device. Magnetic resonance data from the homogeneous water phantom in each plane of interest extending transversely through the imaging volume of the magnetic resonance imaging device then are acquired by a RF body coil and by each of the RF image receiver coils. This magnetic resonance data is stored in the memory of the magnetic resonance imaging device. Thereafter, the central processor calculates, and stores in the memory device, the respective point-by-point ratios of the complex data representing the image from the water phantom provided by said receiver coils to the complex data representing the image from the water phantom provided by the RF body coil.

In a preferred embodiment of the invention, an object of interest is located in the imaging volume of the magnetic resonance imaging device. Magnetic resonance data from the plane of interest is acquired from each of the RF receiver coils and stored in memory. Then, the respective point-by-point ratios of the magnetic resonance data from the plane of interest provided by the receiver coils to the magnetic resonance data from the water phantom are calculated so as to define a scaling factor for each point in the plane of interest. This scaling factor may then be utilized to provide a load-weighted, point-by-point sensitivity profile for each RF receiver coil in each plane of interest parallel to that for which the scaling factor was originally determined.

In still another embodiment of the invention, means are provided for determining and storing in memory the point-by-point time difference of signal reception by each of the receiver coils. This information may be combined with the sensitivity information in the inverse of the matrix of the sensitivity profile so as to provide a phase compensated, load-weighted, point-by-point, inverse, sensitivity profile matrix for each said receiver coil.

Further, it will be understood that the present invention includes apparatus for carrying out each of the above-described methods. Accordingly, the present invention also includes an apparatus for generating a magnetic resonance image of an object of interest—the image being composed of a plurality of adjacent image lines. More specifically, the apparatus preferably constitutes a magnetic resonance imaging device including an imaging volume, preprogrammed central processor, memory device, a body coil surrounding said imaging volume, a plurality of radio frequency receiver coils defining a multi-dimensional array thereof disposed about said imaging volume, and a display device. Each receiver coil in the multi-dimensional array has an associated two-dimensional sensitivity profile. Preferably, the preprogrammed central processing is adapted to calculate each of the sensitivity profiles and to transfer the same to the memory device.

The receiver coils are adapted to acquire simultaneously a plurality of magnetic resonance signals from an object of interest located within the imaging volume, and to transfer the same to the memory device. In addition, the central processor is adapted to reconstruct, and to display on the display device, line-by-line, a two-dimensional image taken in a selected plane extending transversely through the object of interest.

This is accomplished by multiplying the inverse of the matrix of sensitivity profiles of the receiver coils and the matrix of data signals acquired by the receiver coils, and displaying the resultant product on the display device.

In another embodiment, the magnetic resonance imaging device is adapted to acquire, and to transfer to the memory device, magnetic resonance data from a homogeneous phantom in each plane of interest extending through the imaging volume using said body coil. Similarly, the magnetic resonance imaging device also is adapted to acquire, and to transfer to the memory device, magnetic resonance data from a homogeneous water phantom in each plane of interest from each of said receiver coils. Also, the central processor is adapted to calculate, and transfer to the memory device, the respective point-by-point ratios of the magnetic resonance data from the water phantom provided by the receiver coils to the magnetic resonance data from the water phantom provided by the body coil. The component points of each image line may then be refined in the central processor by a corresponding one of these ratios prior to its display on the display device.

In yet another embodiment, the magnetic imaging device is adapted to acquire, and to transfer to the memory device, magnetic resonance data from the object of interest by each of the receiver coils. In this case, the central processor is adapted to calculate, and to transfer to the memory device, the respective point-by-point ratios of the magnetic resonance data from the object of interest provided by the receiver coils to the magnetic resonance data from the water phantom provided by the receiver coils. This ratio defines for each point a scaling factor. The central processor also is adapted to refine the component points of each image line by use of a corresponding one of the scaling factors prior to its display.

Finally, in still another embodiment of the invention, a phase detection device(s) is/are provided for determining and storing in the memory device the point-by-point time difference of signal reception by each of the receiver coils. In this alternative, the central processor is adapted to multiply the point-by-point time difference of signal reception by the point-by-point sensitivity profile for each said surface coil prior to the line-by-line image display on the display device.

These and other features, objects and advantages of the present invention, will be more completely understood by those skilled in the art from the following detailed description of the preferred embodiments of the invention read in conjunction with the drawings which follow.

BRIEF DESCRIPTION OF THE DRAWINGS

In the Drawings:

FIGS. 4A–4C are schematic illustrations of the sensitivity profiles denoted by $W_1(i, j)$, $W_2(i, j)$ and $W_3(i, j)$, respectively;

FIGS. 8A–8B illustratively depict reconstructions of a brain image using the same techniques as the corresponding depictions of FIGS. 7A and 7B, respectively.

DESCRIPTION OF THE PREFERRED EMBODIMENT

As generally noted above, the present invention is implemented in a MRI setting. A parallel acquisition apparatus and method using 2D sensitivity maps of receiver coils disposed in an array at various arbitrary locations about an imaging volume in a magnetic resonance imaging apparatus is provided in order to encode the image space. Applicant hereby incorporates by reference herein the subject matter of U.S. Provisional Patent Application Serial No. 60/135,645.

However, the invention allows for a more general positioning of the RF receiver coils, and can be used to create images derived from any plane in the imaging volume.

Further, the present invention has demonstrated an order of magnitude gain in imaging speed that varies, depending upon the number of coils used in the receiver array. In addition, an easy way of computing the 2D sensitivity profile of a RF receiver coil is provided using a sensitivity map model that may be acquired from a readily available homogeneous water phantom.

Hence, the apparatus and method of this invention are very flexible in that they can be used to speed up any pulse sequence. Indeed, it is anticipated that this novel apparatus and method will be found to be particularly well suited for cardiac imaging applications where fast spin-echo sequences are needed.

Figure 1:
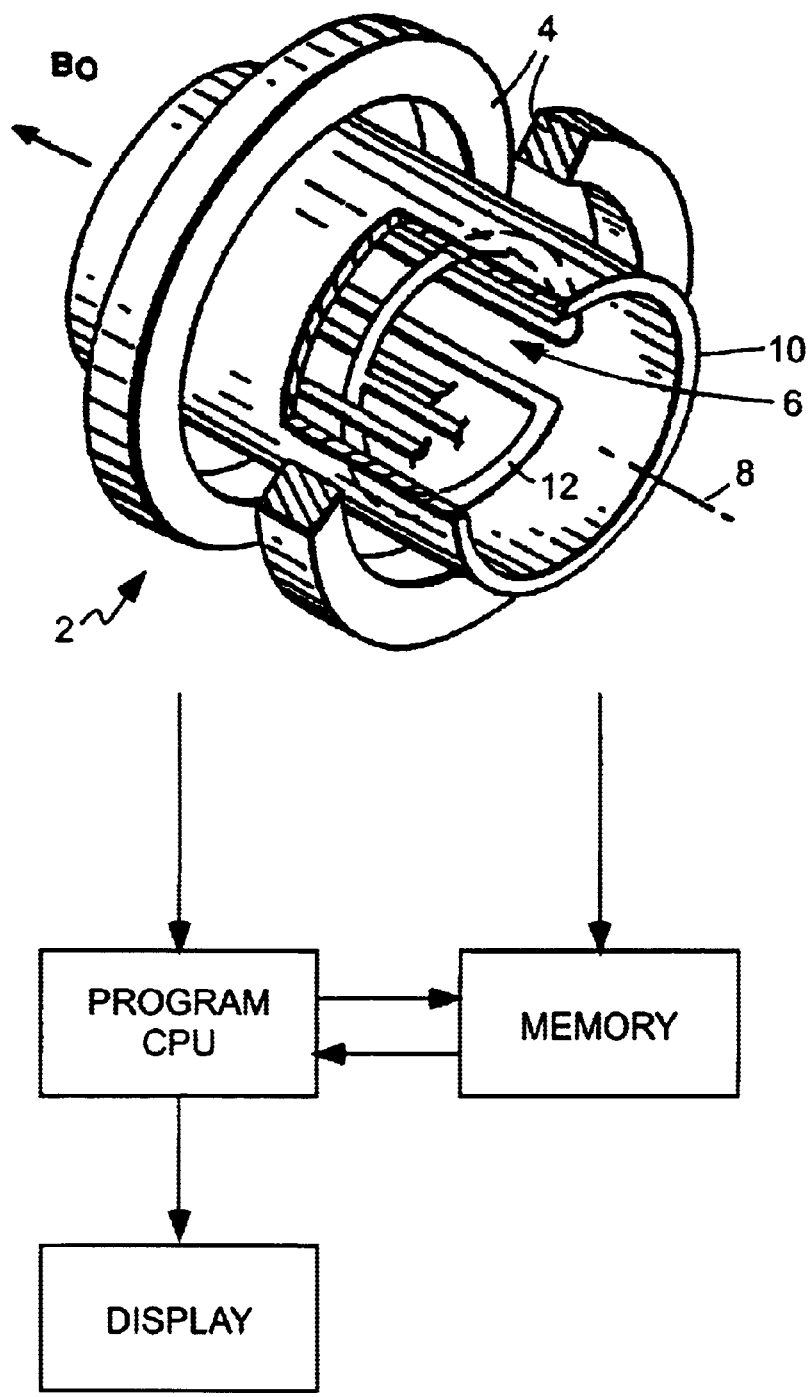
FIG. 1 is an illustrative depiction of a magnetic resonance imaging device in accordance with the present invention.
Figure 1A:
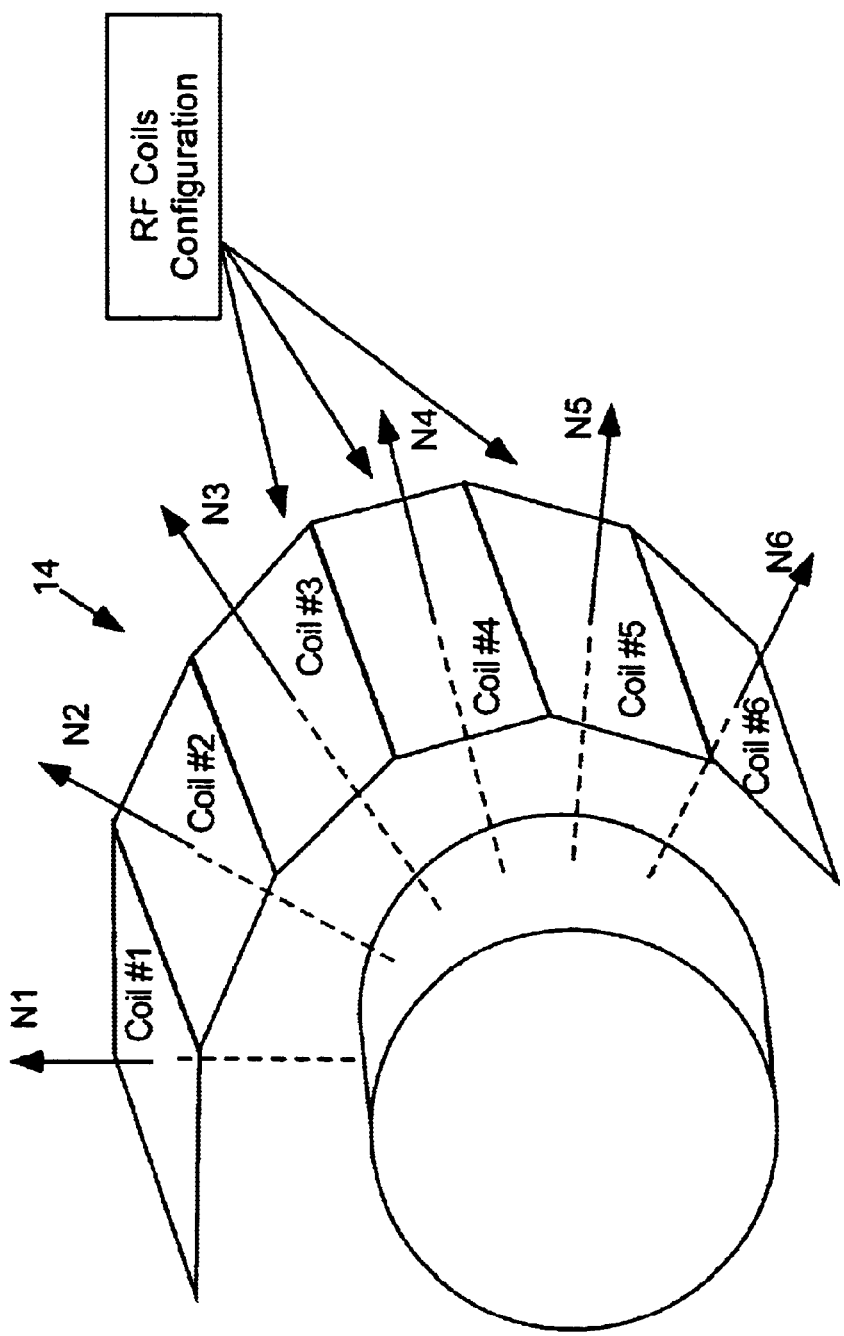
FIG. 1A is a schematic illustration of the disposition of the RF receiver coil array of the present invention disposed at least partially surrounding the imaging volume of the magnetic imaging device shown in FIG. 1.

Referring now to the drawings, and particularly to FIGS. 1 and 1A, it will be seen that the present invention provides a magnetic resonance imaging system. The system includes a plurality of gradient coils that produce spatially encoded gradients imposed upon a background magnetic field $B_o$ within the volume in which the object to be examined is placed. In addition, an array of RF receiver coils is disposed in circumferentially spaced relation to one another about the imaging volume.

More specifically, the magnetic resonance imaging system, generally indicated at 2, may include a Helmholtz coil pair 4 used to generate a large, static, substantially homogeneous magnetic field in the imaging space or volume 6 in a direction parallel to the z-axis or the line 8. An object or subject (not shown) may be placed in the imaging volume within the cylinder 10 for examination using NMR phenomena. The subject is placed on the z-axis or the line 8, and is located within the coil 12. The coil 12 is representative of devices used to generate RF fields in the subject placed in the system for examination.

These RF fields, when in the presence of a static magnetic field $B_o$ cause the occurrence of magnetic resonance in the nuclei of certain elements, such as hydrogen, in the specimen to be examined.

The direction of the static magnetic field ($B_o$) produced by the coil pair 4 is indicated in FIG. 1 by an arrow. Currents are made to flow in the RF coil 12. The direction of the currents reverse each half-cycle of the alternating RF current in coil 12. This produces a transverse magnetic field of low magnitude compared to $B_o$. The magnitude of the flux density resulting from the static magnetic-field intensity $B_o$ may be typically on the order of Tesla.

The static magnetic field $B_o$ is constant while the subject is in the system for analysis or examination. The RF transverse magnetic field is applied for a time sufficient only to allow the protons in the hydrogen atoms (or the nuclei of other atoms exhibiting the magnetic resonance phenomenon) to be affected such that precession of the net magnetization of the subject occurs. The precision of the net magnetic field associated with the nuclei in the subject occurs at the Larmor frequency, which is directly proportional to the magnitude of the magnetic field at the location of the nuclei. This can be detected as an NMR signal which provides the information for reconstruction of an image.

In MRI systems, it is necessary to provide various gradient coils (not shown) for producing spatially encoding gradients that are imposed upon the static magnetic field within the region in which the subject to be examined is placed also are provided. The gradient-coil apparatus is typically positioned on the outside of a cylindrical surface, such as the surface 10, which may be used as a support structure for the gradient coils. The gradient coils conventionally produce linear magnetic field gradients in any of the three orthogonal directions x, y and z. Conventionally, the direction of the line 8 is designated as the z-direction or z-axis and the x- and y-axes of the coordinate system are orthogonal to the z-axis and to one another.

The typical configuration of a z-gradient coil is illustrated in U.S. Pat. No. 4,468,622, the disclosure of which is hereby incorporated by reference herein. The configuration of the typical transverse (x or y) gradient coils is illustrated in U.S. Pat. No. 4,486,711, the disclosure of which also is hereby incorporated by reference herein.

With reference to FIG. 1, the system also includes a central processor 20 which can be a central processing unit (CPU), a memory device 30, and a display device 40.

The present invention also contemplates that an array of RF receiver coils 14 will surround (or partially surround) the imaging volume (see FIG. 1A). FIG. 1A illustrates a schematic representation in 3-D of the Field of View and the RF pickup coil array positioning in a preferred embodiment method of utilzing the present invention. The coil orientations are described by vectors orthogonal to the coils. These RF receiver coils 14 provide the required system calibration and input information necessary to enhance the speed of parallel magnetic resonance data acquisition and parallel image reconstruction, without serious adverse effect upon acceptable signal-to-noise ratios. More simply, the concept of parallel imaging in the present invention is based on using multiple receiver coils, with each coil providing independent information about the image.

Figure 2:
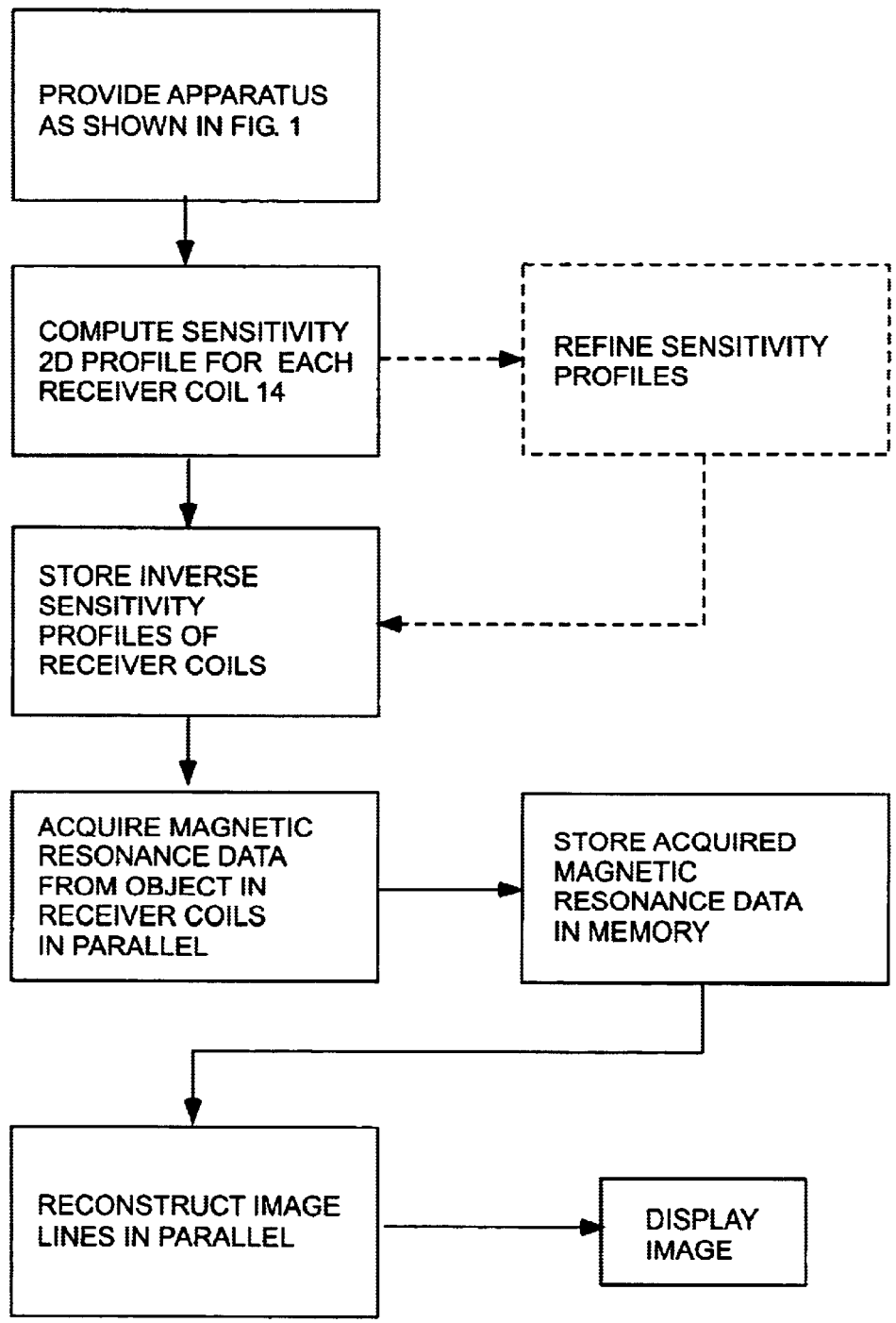
FIG. 2 is a flow chart illustratively depicting the steps of the present method and their interrelationship with one another.

FIG. 2 is a flow diagram illustratively showing the basic sequence of the method of the invention. Thus, it will be seen that the present method contemplates that an apparatus such as that described above will be provided. In this apparatus, the CPU is preprogrammed to carry out numerous operations upon signals received in parallel from various coils of the receiver array, and to output an image to the display device. Among these numerous operations are the following: (1) the computation of the 2D sensitivity profile of each coil of the receiver array; (2) storing the inverse of the calculated sensitivity profile matrix of each coil of the receiver array in memory; and (3) reconstructing an image taken in a selected plane extending transversely through the imaging volume by calculating and transmitting to the display device in parallel with one another the various display lines that make up the entire image.

The theory behind this method has been alluded to above. Specifically, an MR signal received in a receiving coil having $W_k(x,y)$ as its two-dimensional sensitivity profile, when neglecting T2 decay, can be written as:

$$s_k(G_y^g,t) = \int\int \rho(x,y) W_k(x,y) e^{i\gamma(G_x x t + G_y g y \tau)} dx dy$$

Where $\rho(x, y)$ denotes the proton density function, $G_x$ represents the readout gradient amplitude applied in the x direction, $G_y^g$ represents the phase encoding gradient applied during the $g^{th}$ acquisition, x and y represent the x and y positions respectively, and $\tau$ is the pulse width of the phase decoding gradient $G_x$.

In most conventional serial imaging sequences, the phase decoding gradient is constant along one direction, and the phase encoding is applied along an orthogonal direction. In addition, only one receiver coil is used to collect all the data required to reconstruct $\rho(x, y)$. To achieve that, the phase encoding gradient $G_y$ is varied so as to cover all of k-space with the desired resolution. For each value of $G_y^g$, of $G_y$, an echo is acquired. This makes serial imaging a time-consuming procedure. In this technique, however, sensitivity profile information from a number of receiver coils is used in order to minimize the number of acquisitions needed to estimate and reconstruct $\rho(x, y)$. Taking the Fourier Transform of equation (1) along the x direction when a phase encoding gradient $G_y^g$ is applied yields:

$$S_k(G_y^g,x) = \int \rho(x,y) W_k(x,y) e^{i\gamma(G_y g y \tau)} dy$$

This is the phase-modulated projection of the sensitivity-weighted image onto the x-axis. A two-dimensional orthogonal spatial basis function denoted by $\Omega(x, y)$ is used to expand the quantities in equation (2) for the purpose of discretizing it. A constant spatial sampling dwell of $\Delta_s$ is assumed, and the following change of variables is made:

$$x = m\Delta_s \text{ and } y = n\Delta_s.$$

Then, performing the expansion in terms of $\Omega(x, y)$ yields:

$$S_k(G_y^g, m\Delta_s) = \int \Sigma_n \rho(m\Delta_s, n\Delta_s) \cdot W_k(m\Delta_s, n\Delta_s) \cdot e^{i\gamma(G_y g n \Delta_s \tau)} \Omega(x-m, y-n) dy \quad (4)$$

Removing $\Delta s$ and rearranging the terms for simplification, results in:

$$S_k(G_y^f, m) = \Sigma_n \rho(m,n) \cdot W_k(m,n) \cdot e^{i\gamma(G_y g n \tau)}$$

This expression can be converted to matrix form for each position m along the horizontal direction of the image, as follows:

$$\begin{pmatrix} S_1(G_y^1, m) \\ \vdots \\ S_1(G_y^f, m) \\ S_2(G_y^1, m) \\ \vdots \\ S_2(G_y^f, m) \\ \vdots \\ S_k(G_y^1, m) \\ \vdots \\ S_k(G_y^f, m) \end{pmatrix} = \begin{pmatrix} W_1(m,1)\cdot\phi(G_y^1,1) & \cdots & W_1(m,n)\cdot\phi(G_y^1,n) \\ \vdots & \cdots & \vdots \\ W_1(m,1)\cdot\phi(G_y^f,1) & \cdots & W_1(m,n)\cdot\phi(G_y^f,n) \\ W_2(m,1)\cdot\phi(G_y^1,1) & \cdots & W_2(m,n)\cdot\phi(G_y^1,n) \\ \vdots & \cdots & \vdots \\ W_2(m,1)\cdot\phi(G_y^f,1) & \cdots & W_2(m,n)\cdot\phi(G_y^f,n) \\ \vdots & \cdots & \vdots \\ W_k(m,1)\cdot\phi(G_y^1,1) & \cdots & W_k(m,n)\cdot\phi(G_y^1,n) \\ \vdots & \cdots & \vdots \\ W_k(m,1)\cdot\phi(G_y^f,1) & \cdots & W_k(m,n)\cdot\phi(G_y^f,n) \end{pmatrix} \cdot \begin{pmatrix} \rho(m,1) \\ \rho(m,2) \\ \rho(m,3) \\ \vdots \\ \rho(m,n) \end{pmatrix}$$

Where f is the number of phase encodes used in the experiment, $\phi(G_y^g,p) = e^{i\gamma(G_y g p \tau)}$ for every position p along the y axis and every phase encoding gradient value $G^g_y$. Equation (6) can be written in a more compact form as follows:

$$[S_k(G^g_y,m)]=[W_k(m,n).e^{j\gamma(G_yg(n)\tau)}].[\rho(m,n)]$$

Where $[S_k(G^g_y, m)]$ represents a matrix of dimensions (K×N), and K is the product of the number of coils k in the array by the number of phase encodes acquired f, which is equal to the number of echoes collected in all the coils combined; M is the number of time points per echo, which is equal to the number of pixels resolved in the x direction, and N is the desired number of pixels in the y direction. For square image matrices, M must equal N.

The matrix $[A_m(k,y)]=[W_k(m,n).ei\gamma(Gy(n)\tau)]$ is three-dimensional with dimensions (K×M×N), and $[\rho(m,n)]$ represents the image of size (M×N). If the matrix index m is fixed to a value $m_j$, the size of $[A_{mj}]$ then becomes (K×N). Hence, in order to reconstruct the image $[\rho(m,n)]$, a matrix pseudoinverse of $[A_{mj}(k,y)]$ is computed for every position $m_j$ along the x-axis. This yields a column by column reconstruction. The choice of K affects the quality of the reconstruction. Practically, increasing K would result in an increase of the rank of the matrix $[A_{mj}(k,y)]$, yielding a pseudoinverse that is better conditioned. Equation 10 is schematically represented in FIG. 3 for clarity.

Figure 3:
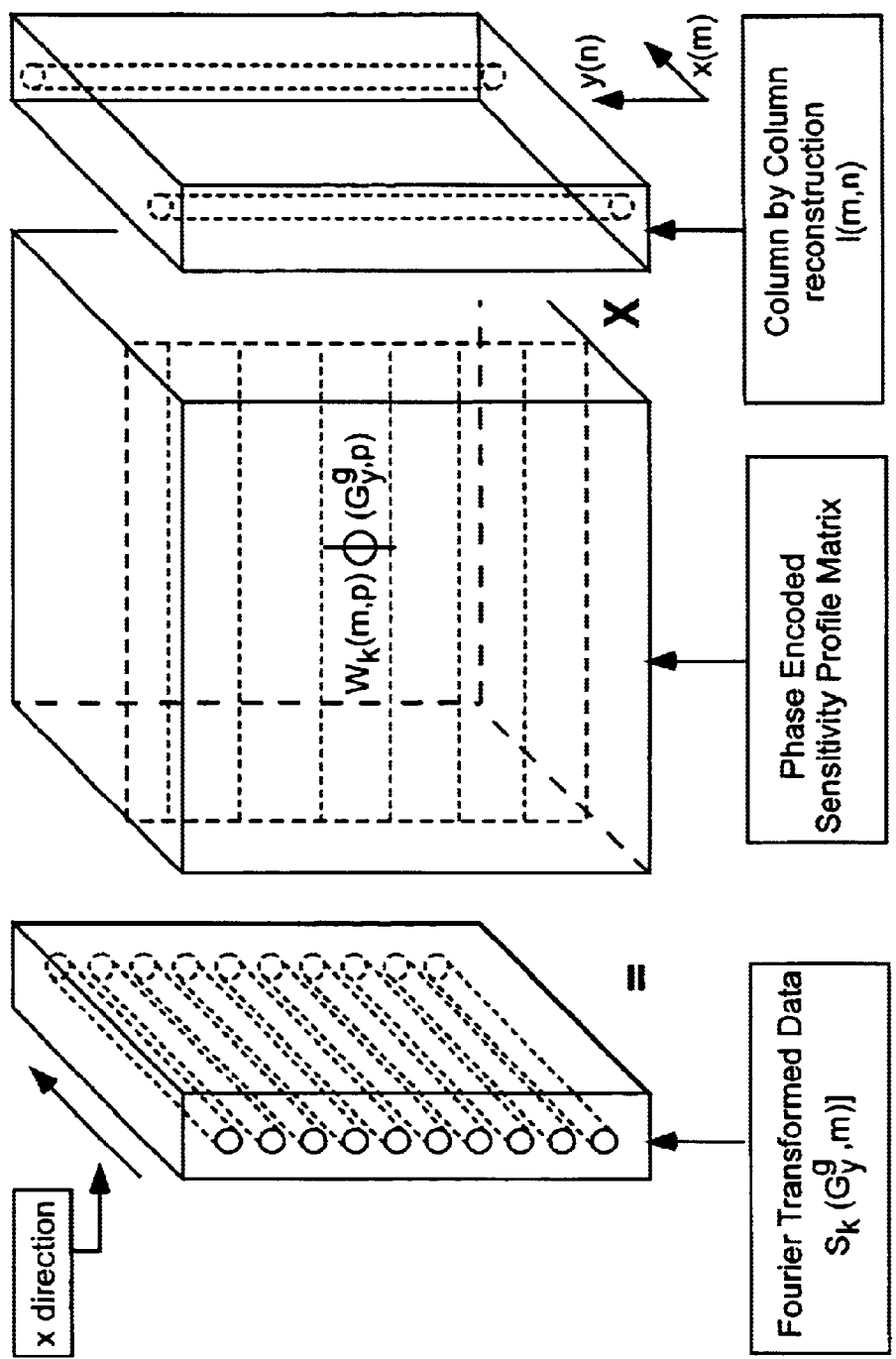
FIG. 3 is a schematic representation of the MRI acquisition and image reconstruction scheme of the present invention.

FIG. 3 illustrates a schematic representation of the parallel reconstruction scheme. The matrix to the left represents the 1DFT of the k-space data chosen for reconstruction, the matrix in the center is the three dimensional sensitivity matrix referred to by A in the text herein, and the matrix on the right represents the image to be reconstructed.

Figure 4:
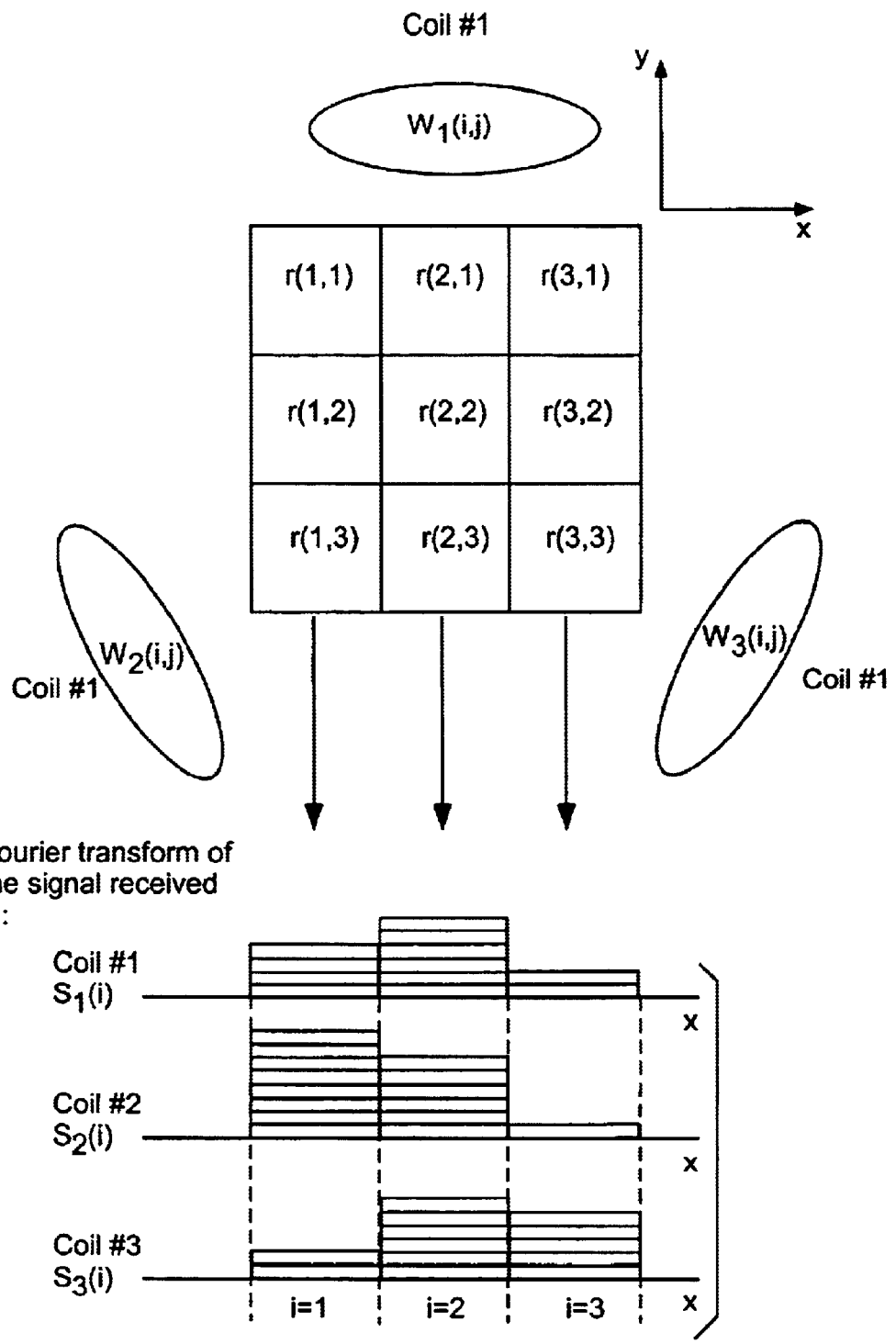
FIG. 4 is a schematic illustration of an exemplary one-dimensional version of the acquisition and image reconstruction scheme of the present invention.

In addition, a simplified version of the above concepts is depicted in FIG. 4, and described hereinbelow, to further clarify the present method. With reference to FIG. 4, the Fourier Transform of the signals received in all three coils respectively is equal to the projection of the phase encoded image weighted by the three profiles $W_1(i,j)$, $W_2(i,j)$, $W_3(i,j)$ respectively onto the x axis.

Assume the image to be of size 3×3 as shown in FIG. 4, where each pixel has an intensity value denoted by r(i,j), where i is the column number and j is the row number. The goal is to determine and reconstruct the values of r(i,j) for all the pixels of the image. Further assume that three coils 1, 2 and 3 are arrayed around the image, and are used for image acquisition as shown in FIG. 4. These coils have sensitivity profiles denoted by $W_1(i,j)$, $W_2(i,j)$, $W_3(i,j)$, respectively. (see FIGS. 4A–4C).

The sensitivity profiles of the coils are determined from a homogeneous image by placing a water phantom whose pixel intensity values are equal to I(i,j) into the imaging volume, and acquiring its image using any chosen pulse sequence with the body coil whose sensitivity profile $W_b(i,j)=1$ for all the pixels in the image. The reconstructed image would have pixel intensity values of $r_b(i,j)=I(i,j)$ for all pixels. Next, images are acquired using the 3 coils shown in FIG. 4 with respective sensitivity profiles $[W_1(i,j)]$, $[W_2(i,j)]$, $[W_3(i,j)]$ to get three images of pixel intensity values equal to $[I(i,j).W_1(i,j)]$, $[I(i,j).W_2(i,j)]$, $[I(i,j).W_3(i,j)]$, respectively. Taking the point-by-point ratio of the images acquired using the three coils in the array divided by the RF body coil image yields the sensitivity profiles $W_1(i,j)$, $W_2(i,j)$, and $W_3(i,j)$, respectively.

Thereafter, the homogeneous water phantom is replaced with the object of interest to be imaged. This object has pixel intensities r(i,j) as shown in FIG. 4. The MR signal received in coil k can be written as:

$$S_k(t)=\int\int r(x,y).W_k(x,y).e^{j\gamma(G_xxt+G_yy\tau)}dx.dy$$

Where $G_x$ and $G_y$ represent the gradients applied in the x and y directions respectively. Then taking the fourier transform with respect to x provides:

$$s_k(x)=\int r(x,y).W_k(x,y).e^{j\gamma(G_yy\tau)}dy$$

This is the phase modulated projection of the image r (x,y) weighted by the sensitivity profile $W_k(i,j)$ onto the x-axis. Discretizing, wherein the index i corresponds to a discrete x position and the index j corresponds to a discrete y position, provides:

$$s_k(i)=\Sigma_j r(i,j).W_k(i,j).e^{j\gamma(G_yj\tau)}$$

whereby in coil 1, $$s_1(i)=r(i,1).W_1(i,1).e^{j\gamma(G_y1\tau)}+r(i,2).W_1(i,2).e^{j\gamma(G_y2\tau)}+r(i,3).W_1(i,3).e^{j\gamma(G_y3\tau)}$$

In coil 2, $$s_2(i)=r(i,1).W_2(i,1).e^{j\gamma(G_y1\tau)}+\tau(i,2).W_2(i,2).e^{j\gamma(G_y2\tau)}+\tau(i,3).W_2(i,3).e^{j\gamma(G_y3\tau)}$$

and in coil 3, $$s_3(i)=r(i,1).W_3(i,1).e^{j\gamma(G_y1\tau)}+\tau(i,2).W_3(i,2).e^{j\gamma(G_y2\tau)}+\tau(i,3).W_3(i,3).e^{j\gamma(G_y3\tau)}$$

These equations represent the modulated projections of the image onto the x axis. They also are three linear equations with three unknowns [r(i,1), r(i,2),r(i,3)] for every position i along the x axis. Recalling that the goal is to solve for the pixel intensity values of the vector [r(i,1), r(i,2),r(i,3)] which is a column of the image at position i along the x axis, it is noted that the following equation may be written for each position i along the x axis:

$$\begin{pmatrix} s_1(i) \\ s_2(i) \\ s_3(i) \end{pmatrix} = \begin{pmatrix} W_1(i,1)\cdot e^{j\gamma(G_y1\tau)} & W_1(i,2)\cdot e^{j\gamma(G_y2\tau)} & W_1(i,3)\cdot e^{j\gamma(G_y3\tau)} \\ W_2(i,1)\cdot e^{j\gamma(G_y1\tau)} & W_2(i,2)\cdot e^{j\gamma(G_y2\tau)} & W_2(i,3)\cdot e^{j\gamma(G_y3\tau)} \\ W_3(i,1)\cdot e^{j\gamma(G_y1\tau)} & W_3(i,2)\cdot e^{j\gamma(G_y2\tau)} & W_3(i,3)\cdot e^{j\gamma(G_y3\tau)} \end{pmatrix} \cdot \begin{pmatrix} \tau(i,1) \\ \tau(i,2) \\ \tau(i,3) \end{pmatrix}$$

Subsequently, solving for the vector $$\begin{pmatrix} \tau(i,1) \\ \tau(i,2) \\ \tau(i,3) \end{pmatrix}$$

one takes the inverse of the matrix $$\begin{pmatrix} W_1(i,1)\cdot e^{j\gamma(G_y1\tau)} & W_1(i,2)\cdot e^{j\gamma(G_y2\tau)} & W_1(i,3)\cdot e^{j\gamma(G_y3\tau)} \\ W_2(i,1)\cdot e^{j\gamma(G_y1\tau)} & W_2(i,2)\cdot e^{j\gamma(G_y2\tau)} & W_2(i,3)\cdot e^{j\gamma(G_y3\tau)} \\ W_3(i,1)\cdot e^{j\gamma(G_y1\tau)} & W_3(i,2)\cdot e^{j\gamma(G_y2\tau)} & W_3(i,3)\cdot e^{j\gamma(G_y3\tau)} \end{pmatrix}$$

and multiplies it with the vector $$\begin{pmatrix} s_1(i) \\ s_2(i) \\ s_3(i) \end{pmatrix}$$

with the result that:

$$\begin{pmatrix} \tau(i,1) \\ \tau(i,2) \\ \tau(i,3) \end{pmatrix} = \begin{pmatrix} W_1(i,1)\cdot e^{j\gamma(G_y l\tau)} & W_1(i,2)\cdot e^{j\gamma(G_y 2\tau)} & W_1(i,3)\cdot e^{j\gamma(G_y 3\tau)} \\ W_2(i,1)\cdot e^{j\gamma(G_y l\tau)} & W_2(i,2)\cdot e^{j\gamma(G_y 2\tau)} & W_2(i,3)\cdot e^{j\gamma(G_y 3\tau)} \\ W_3(i,1)\cdot e^{j\gamma(G_y l\tau)} & W_3(i,2)\cdot e^{j\gamma(G_y 2\tau)} & W_3(i,3)\cdot e^{j\gamma(G_y 3\tau)} \end{pmatrix}^{-1} \cdot \begin{pmatrix} s_1(i) \\ s_2(i) \\ s_3(i) \end{pmatrix}$$

Hence, the image may be reconstructed column by column in parallel.

As described above, the method of the present invention is based on using the sensitivity profiles of RF receiver coils to encode MR data. As suggested in the above simplified example, it is possible to calculate these profiles by first acquiring a baseline image of a homogeneous water phantom using a RF coil with a homogeneous sensitivity profile covering the whole image. This image can be written as $I(x,y)$. Subsequently, images of the same water phantom are acquired using the receiver coils. The image acquired using the $k^{th}$ receiver coil can be represented as $I(x,y)\cdot W_k(x,y)$ where $W_k(x,y)$ is the sensitivity profile of the surface coil.

Then, taking the point-by-point ratio of the two images yields the sensitivity profile $W_k(x,y)$. It, however, must be understood that the sensitivity profiles of the receiver coils also depends upon their loading.

In the present invention, the variations incurred by these profiles amounts to a constant scaling between any two different loads. Consequently, to find the actual sensitivity profile of the receiver coils when loaded with an arbitrary object of interest, sensitivity profile estimation on that object as described above is performed. Then, a comparison (ratio) of those sensitivity profiles to the sensitivity profiles computed on the basis of a homogeneous water phantom is made in order to extract the scaling factor. The sensitivity profiles calculated from the homogeneous water phantom are then multiplied by the scaling factor so computed, and the result is used in the encoding scheme. This is done in order to get the maximum coverage possible of the field of view by the sensitivity profile. Other methods have been described in the literature for performing a sensitivity profile calculation. However, the technique described and illustrated above appears to be particularly well suited for our reconstruction method. This is particularly true since the method is not time-consuming, and it can be carried out essentially in real time.

In order to appropriately account for all of the frequencies included in the image, the choice of the phase modulations used in the inversion matrix should be determined by the frequency content of the sensitivity profile. In most cases, the sensitivity profiles of RF coils have low frequency content. Accordingly, high frequency phase modulations should be used to well represent the image. This means that appropriate k-space lines can be chosen by those skilled in the art for an optimal reconstruction.

EXAMPLES

Experiments were performed on a 1.5T GE SIGNA clinical MRI system at the 5.4 hardware-software configuration. The purpose of these experiments was to test the performance of the present methodology. In the experiments, image resolution was 256×256 pixels. A 16-echo RARE sequence, TR=2 sec, TE=30 ms per shot, were utilized to obtain one dynamic image update with a single shot.

In order to assess the technique herein described, simulations were performed.

In one case, a homogeneous MR data of a brain first was acquired using a head coil. Then, two further sets of MR data were acquired of a homogeneous water phantom—one using the head coil, and the other using a surface coil. The sensitivity profile of the receiver coil was then computed by taking the point-by-point ratio of the water phantom data acquired using the receiver coil over the data acquired using the head coil, as described above. Thereafter, sensitivity profiles were computed for RF receiver coils disposed about the object of interest with an angle of $2\pi/16$ between any adjacent two of them. Next, the computed sensitivity profiles were multiplied point-by-point with the brain data to get approximations of sensitivity weighted images from surface coils placed at different positions. These images are shown in FIG. 5.

Figure 5:
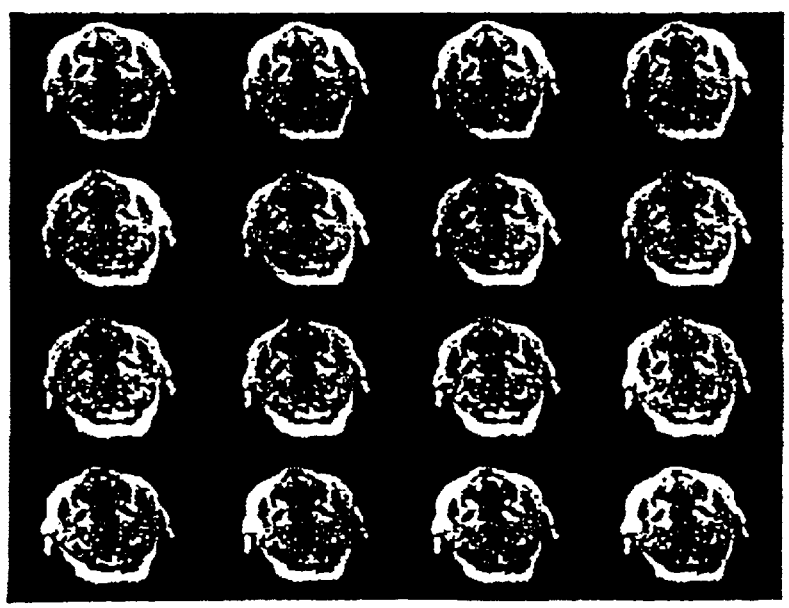
FIG. 5 is a composite image depicting simulation images received with a coil having the same sensitivity profile placed at 16 different positions about a brain.

FIG. 5 illustrates a simulation of the images received with a coil having the same sensitivity profile placed at 16 different positions around the brain.

Figure 6:
FIG. 6 is a composite image showing the results of a reconstruction simulation using different sets of k-space lines.

The sensitivity-weighted images were then Fourier Transformed in two dimensions in order to get the relevant k-space data. Subsequently, 16 lines of k-space data were taken from each matrix, and those lines were used to reconstruct the head image using our technique. As mentioned, the choice of the k-space lines affects the image resolution. FIG. 6 illustrates results of the reconstruction simulation using different sets of k-space lines. From left to right, the images were reconstructed by using the k-space lines acquired from skipping respectively 1, 5, 10, and 16 lines.

In FIG. 6, four images acquired using different sets of k-space data are shown. The image on the left shows a reconstruction using the 16 lines of k-space going between k=−7 and k=8; the second image from the left shows a reconstruction using the 16 lines of k-space going between k=−39 and k=40 and acquiring every $5^{th}$ line. The third image from the left shows a reconstruction using the lines of k-space going between k=−79 to k=80, and acquiring every $10^{th}$ line.

Finally, the image on the right shows a reconstruction using the 16 lines of k-space going between k=−127 to k=128, and acquiring every $16^{th}$ line. It can be seen that the third image from the left represents the best result of the four shown. Further, a certain deterioration of the image is observed as more lines are skipped before reconstruction. An optimal combination of k-space lines can be found to achieve the desired result.

Figures 7A, 7B:
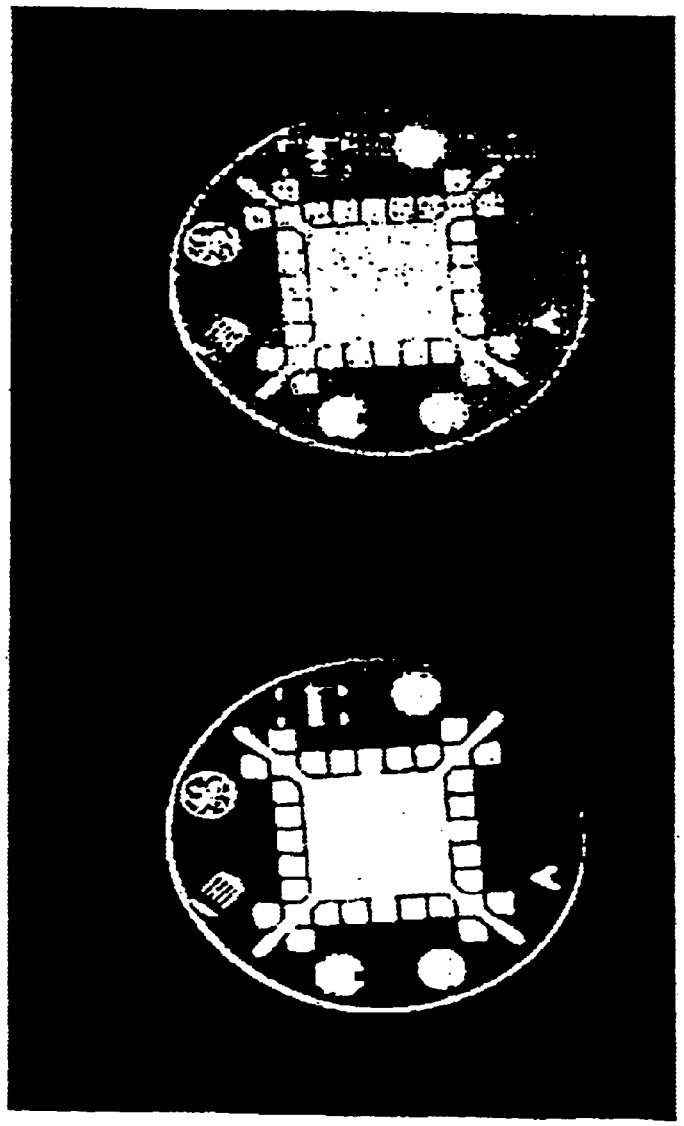
FIGS. 7A–7B illustratively depict reconstructions of a (256×256) image of a GE quality phantom using the body coil and receiver coils with a 16 fold speed enhancement.

In another experiment, baseline data of the human head was acquired using the head coil. Then, using a receiver coil, 16 data sets from the human head taken at different coil positions were acquired. These data sets then were used in conjunction with the baseline data to calculate the sensitivity profiles of the coil at different positions using the point-by-point ratio method described above. These sensitivity profiles were then used in order to reconstruct images using only 16 lines of k-space from each coil. The results of these experiments are shown respectively in FIGS. 7A and 7B and FIGS. 8A and 8B. FIGS. 7A and 7B illustrate experimental results. The left figure (FIG. 7B) shows an image of a GE quality phantom acquired using a RARE sequence, and the image on the right (FIG. 7A) shows the same image acquired with a 16 fold speed enhancement using the present invention.

FIGS. 8A and 8B illustrate experimental results. The left figure (FIG. 8B) shows a brain image acquired using a RARE sequence, and the image on the right (FIG. 8A) shows the same image acquired with a 16 fold speed enhancement using the technique of the present invention.

Accordingly, it will be understood that a parallel imaging and reconstruction method has been designed and implemented which is intended to substantially increase imaging speed in MRI. This technique is based on using 2D sensitivity profile maps derived from an array of receiver coils surrounding an imaging volume in order to encode and reconstruct MRI data in parallel. Therefore, imaging time may be reduced in proportion to the number of receiving coils present in the array. Further, this technique is adaptable to all imaging sequences, and to all imaging planes, thereby making it very practical in a clinical setting. Still further, the placement of the RF receiving coils may be arbitrary, around the imaged field of view. This allows for the placement of more RF coils in the receiver array, which in turn enables faster imaging. Nevertheless, since there is a tradeoff between coil size and penetration, an optimal number of coils can be computed to yield the best results.

Still further, in most parallel imaging schemes, decoupling of the RF receiver coils in the array is a necessary step before imaging. In the present invention, however, the coupling information between the different coils is incorporated into the reconstruction algorithm. This makes it easier to design and execute arrays that contain a large number of coils.

In the foregoing discussion, the sensitivity profiles of the respective receiver coils have been suggested to be independent of the coil loading. This permits an extrapolation of the results of the sensitivity profiles computed from a water phantom to be used in the encoding of MR data acquired from other objects. In reality however, loading affects the sensitivity profiles of the coil elements. Accordingly, the dynamic method of sensitivity profile adjustment for each different object to be imaged required in the course of the generation of images having practical utility.

It is to be understood that this description of certain presently preferred embodiments of the present invention has been provided by way of illustration, and not limitation. Various alterations, changes, variations, modifications and the like encompassed within the scope of the present invention in its broadest aspects will occur to those skilled in the art in view of the teachings and descriptions contained in this specification. For example, the array of receiver coils may be used to emit the RF signal to eliminate the need for a RF body coil. Accordingly, the scope, content and limitations of the present invention are to be determined solely from the appended claims.

What is claimed is:

1. A method for generating a magnetic resonance image of an object of interest, wherein said image consists of a plurality of adjacent image lines, said method comprising:

providing a magnetic resonance imaging device comprising a magnetic system providing a homogeneous magnetic background field in an imaging volume, a RF body coil surrounding said imaging volume, and a plurality of radio frequency receiver coils defining a multi-dimensional array thereof disposed about said imaging volume;

determining a two-dimensional sensitivity profile for each said receiver coil in said multi-dimensional array;

acquiring simultaneously a plurality of magnetic resonance signals from said object of interest located within said imaging volume from each said receiver coil;

reconstructing a two-dimensional image taken in a selected plane extending through said object of interest using said two-dimensional sensitivity profile and said plurality of magnetic resonance signals;

wherein said method further comprises:
providing a homogeneous water phantom;
locating said homogeneous water phantom in said image volume;
acquiring magnetic resonance data from said homogeneous water phantom in each plane of interest extending transversely through said imaging volume using said RF body coil;
using a two-dimensional Fourier Transformation to provide complex image data representing an image of said homogeneous water phantom in each said plane for said body coil;
acquiring magnetic resonance data from said homogeneous water phantom in each plane of interest extending transversely through said imaging volume using each of said of RF receiver coils;
using a two-dimensional Fourier transformation to provide complex image data representing an image of said homogeneous water phantom in each said plane for each receiver coil; and
determining the respective point-by-point ratios of said complex image data from said water phantom provided by said receiver coils to said magnetic resonance data from said water phantom provided by said body coil, thereby obtaining a sensitivity map for each receiver coil.

2. The method of claim 1, further comprising:

locating an object of interest in said imaging volume;

acquiring magnetic resonance data from said object in each plane of interest extending transversely through said imaging volume using said RF body coil;

using a two-dimensional Fourier Transformation to provide complex image data representing an image of said object in each said plane for the body coil;

acquiring magnetic resonance data from said object in each plane of interest extending transversely through said imaging volume using each of said RF receiver coils;

using a two-dimensional Fourier Transformation to provide complex image data representing an image of said object in each said plane for each receiver coil; and calculating in said central processor and storing in said memory the respective point-by-point ratios of said complex image data from said object of interest provided by said receiver coils to said complex image data of said object of interest from said body coil to define for each said point a scaling factor.

3. An apparatus for generating a magnetic resonance image of an object of interest, wherein said image is composed of a plurality of adjacent image lines; said apparatus comprising:

a magnetic resonance imaging device comprising a magnet system providing a homogeneous magnetic background field in an imaging volume, a preprogrammed central processor, a memory device, a RF body coil surrounding said imaging volume, a plurality of radio frequency receiver coils defining a multi-dimensional array thereof disposed about said imaging volume, and a display device;

wherein each said receiver coil in said multi-dimensional array has an associated two dimensional sensitivity profile, said preprogrammed central processor is adapted to calculate each said sensitivity profile and to transfer same to said memory device;

wherein said receiver coils are adapted to acquire simultaneously a plurality of magnetic resonance signals of said object of interest located within said imaging volume and to transfer same to said memory device; and wherein said central processor is adapted to reconstruct, and to display on said display device, line-by-line, a two-dimensional image taken in a selected plane extending transversely through said object of interest by using said sensitivity profile of each said coil and corresponding signals from each of said receiver coils;

wherein said magnetic resonance imaging device further is adapted to acquire and to transfer to said memory device at least one of magnetic resonance data from a homogeneous water phantom in each plane of interest extending transversely through said imaging volume using said body coil, and magnetic resonance data from said homogeneous water phantom in each said plane of interest from each of said receiver coils, and wherein said central processor at least one of calculates and transfers to said memory device the respective point-by-point first ratios of complex image data on said water phantom provided by said receiver coils to corresponding complex image data of said water phantom provided by said body coil.

4. A method for generating a magnetic resonance image of an object of interest, comprising:

providing a magnetic resonance imaging device comprising a magnet system providing a homogeneous magnetic background field in an imaging volume, a RF body coil surrounding said imaging volume, and a plurality of radio frequency receiver coils defining a multi-dimensional array thereof disposed about said imaging volume;

determining a 2-dimensional sensitivity profile for each said receiver coil in said multi-dimensional array;

acquiring simultaneously a plurality of magnetic resonance signals from said object of interest located within said imaging volume from each said receiver coil; and reconstructing a 2-dimensional image taken in a selected plane extending through said object of interest using said two-dimensional sensitivity profile and said plurality of magnetic resonance signals:

wherein said method further comprises:

providing a homogeneous water phantom; locating said homogeneous water phantom in said image volume;

acquiring magnetic resonance data from said homogeneous water phantom in each plane of interest extending transversely through said imaging volume using said RF body coil;

using a two-dimensional Fourier transform to provide complex image data representing an image of said homogeneous water phantom in each said plane for the body coil;

acquiring magnetic resonance data from said homogeneous water phantom in each plane of interest extending transversely through said imaging volume using each of said RF receiver coils;

using a 2-dimensional Fourier transform to provide complex image data representing an image of said homogeneous water phantom in each said plane for each receiver coil; and determining the respective point-by-point ratios of said complex image data from said water phantom provided by said receiver coils to said magnetic resonance data from said water phantom provided by said body coil, thereby obtaining a sensitivity map for each receiver coil.

5. The method of claim 4, further comprising:

locating an object of interest in said imaging volume;

acquiring magnetic resonance data from said object in each plane of interest extending transversely through said imaging volume using said RF body coil;

using a two-dimensional Fourier Transformation to provide complex image data representing an image of said object in each said plane for the body coil;

acquiring magnetic resonance data from said object in each plane of interest extending transversely through said imaging volume using each of said RF receiver coils;

using a two-dimensional Fourier Transformation to provide complex image data representing an image of said object in each said plane for each receiver coil; and calculating in said central processor and storing in said memory device the respective point-by-point ratios of said complex image data from said object of interest provided by said receiver coils to said complex image data of said object of interest from said body coil to define for each said point a scaling factor.

6. The method of claim 4, wherein said image consists of a plurality of adjacent image lines.

7. An apparatus for generating a magnetic resonance image of an object of interest, comprising:

A magnetic resonance imaging device further comprising a magnet system providing a homogeneous magnetic background field in an imaging volume, a preprogrammed central processor, a memory device, a RF body coil surrounding said imaging volume, a plurality of radio frequency receiver coils defining a multi-dimensional array thereof disposed about said imaging volume, and a display device;

where in each said receiver coil in said multi-dimensional array has an associated two-dimensional sensitivity profile, said preprogrammed central processing is adapted to calculate each said sensitivity profile and to transfer same to said memory device;

wherein said receiver coils are adapted to acquire simultaneously a plurality of magnetic resonance signals of said object of interest located within said imaging volume and to transfer same to said memory device; and wherein said central processor is adapted to reconstruct, and to display on said display device, line-by-line, a two-dimensional image taken in a selected plane extending transversely through said object of interest by using said sensitivity profile of each said coil and corresponding signals from each of said receiver coils;

wherein said magnetic resonance imaging device at least one of acquires and transfers to said memory device at least one of magnetic resonance data from a homogeneous water phantom in each plane of interest extending transversely through said imaging volume using said body coil, and magnetic resonance data from said homogeneous water phantom in each said plane of interest from each of said receiver coils, and wherein said central processing device at least one of calculates and transfers to said memory device the respective point-by-point first ratios of complex image data of said water phantom provided by said receiver coils to corresponding complex image data on said water phantom provided by said body coil.

8. A method for generating a magnetic resonance image of an object of interest wherein said image consists of a plurality of adjacent image lines, said method comprising the steps of:

a) providing a magnetic resonance imaging device comprising a magnet system providing a homogeneous magnetic background field in an imaging volume, a RF body coil surrounding said imaging volume, and a plurality of radio frequency receiver coils defining a multi-dimensional array thereof disposed about said imaging volume;

b) determining multi-dimensional sensitivity profile for each said receiver coil in said multi-dimensional array;

c) acquiring simultaneously a plurality of magnetic resonance signals from said object of interest located within said imaging volume from each said receiver coil;

d) reconstructing a multi-dimensional image of a selected portion of said object of interest using said multi-dimensional sensitivity profile and said plurality of magnetic resonance signals;

wherein step (b) further comprises:
  (i) providing a homogeneous phantom;
  (ii) locating said homogeneous phantom in said image volume;
  (iii) acquiring magnetic resonance data from said homogeneous phantom in a region of interest extending transversely through said imaging volume using said RF body coil;
  (iv) using a multi-dimensional Fourier Transformation on said data acquired by said body coil to provide complex image data representing an image of said homogeneous phantom in said region of interest for the body coil;
  (v) acquiring magnetic resonance data from said homogeneous phantom in said region of interest extending transversely through said imaging volume using each of said RF receiver coils;
  (vi) using a multi-dimensional Fourier Transformation on said data acquired from each RF receiver coil to provide complex image data representing an image of said homogeneous phantom in said region of interest for each receiver coil; and
  (vii) determining the respective point-by-point ratios of said complex image data from said phantom provided by said receiver coils to said complex image data from said phantom provided by said body coil, thereby obtaining said sensitivity profile for each receiver coil.

9. The method according to claim 8, wherein step (b) further comprises:

(viii) locating an object of interest in said imaging volume;
  (ix) acquiring magnetic resonance data from said object in a region of interest extending transversely through said imaging volume using said RF body coil;
  (x) using a multi-dimensional Fourier Transformation on said data acquired from the object by the RF body coil to provide complex image data representing an image of said object in each said region of interest for the body coil;
  (xi) acquiring magnetic resonance data from said object in said region of interest extending transversely through said imaging volume using each of said RF receiver coils;
  (xii) using a multi-dimensional Fourier Transformation on said data acquired from the object by each RF receiver coil to provide complex image data representing an image of said object in said region of interest for each receiver coil; and
  (xiii) calculating in said central processor and storing in said memory the respective point-by point ratios of said complex image data from said object of interest provided by said receiver coils to said complex image data of said object of interest from said body coil to define for each said point a scaling factor, so as to achieve a second sensitivity profile for each receiver coil.

10. The method according to claim 9 further including using a comparison of the sensitivity profile calculated for each given receiver coil from data derived from said phantom with the second sensitivity profile calculated for the given receiver coil from data derived from the object of interest, to adjust the values of the sensitivity profiles derived from the phantom for given receiver coil.

11. The method according to claim 8, wherein said homogeneous phantom is a water phantom.

12. The method according to claim 8, wherein the images produced are 2 dimensional images and the imaging volumes are planar.

13. An apparatus for generating a magnetic resonance image of an object of interest, wherein said image is composed of a plurality of adjacent image lines; said apparatus comprising:

a magnetic resonance imaging device comprising a magnet system providing a homogeneous magnetic background field in an imaging volume, at least one programmed processor, memory, a RF body coil surrounding said imaging volume, a plurality of radio frequency receiver coils defining a multi-dimensional array thereof disposed about said imaging volume, and a display device;

wherein each of said receiver coil in said multi-dimensional array has an associated multi-dimensional sensitivity profile; said programmed processor is adapted to calculate each said sensitivity profile and transfer same to said memory;

wherein said receiver coils are adapted to acquire simultaneously a plurality of magnetic resonance signals of said object of interest located within said imaging volume and to transfer same to said memory; and wherein said processor is adapted to reconstruct, and to display device on said display device, line-by-line, a multi-dimensional image taken in a selected portion of said object of interest by using said sensitivity profile of each said coil in corresponding signals from each said receiver coils; and wherein said magnetic resonance imaging device further is adapted to acquire and to transfer to said memory:

(i) magnetic resonance data from a homogeneous phantom in each region of interest extending transversely through said imaging volume using said body coil, and (ii) magnetic resonance data from said homogeneous phantom in each said region of interest from each of said receiver coils; said processor is adapted (1) to calculate and transfer to said memory the respective point-by-point ratios of complex image data of said phantom provided by said receiver coils to corresponding complex image data of said phantom provided by said body coil.

14. A method for generating a nuclear magnetic resonance (i.e., NMR) image of an object of interest, said method comprising:

acquiring a data set comprised of a plurality of NMR time domain signals, each of which is induced into one or more receiver coils by the NMR of different nuclei at different locations throughout an image generating volume in the object of interest, wherein the component of each such signal that comes from NMR at a given location in said image generating volume is:

encoded along a frequency-encoded dimension by position dependent frequency shifts induced by a magnetic field gradient along said frequency encoded dimension; and encoded along at least one other, phase-encoded, dimension by a set of one or more position dependent phase shifts induced by one or more different magnetic field gradient along said phase-encoded dimension;

using a one dimensional Fourier Transform along the frequency-encoded dimension on the NMR time domain signals of said acquired data set to separate information contained in each such time domain signal into separate portions corresponding to information derived from the NMR of nuclei from a regions in said image generating volume at a given location along said frequency-encoded dimension;

separately solving for each given one of a succession of locations along the frequency-encoded dimension, a system of equations defined by the NMR information derived by said one dimensional Fourier Transformation from each of a plurality of said NMR time domain signals for the given location along said frequency-encoded dimension, so as to generate a portion of the generated image corresponding to the given location along the frequency-encoded dimension.

15. The method according to claim 14 wherein:

different ones of said time-domain signals are acquired with different phase-shift gradients along said phase-encoded dimension;

the one dimensional Fourier Transform performed on each time domain signal determines a complex value at each of a plurality of frequency, each of which frequencies corresponds to one of said successive locations along the frequency-encoded dimension; and the solving of a system of equations for each given location along the frequency-encoded dimension includes using the complex value determined for the given location by the one dimensional Fourier Transform of each different time domain signal.

16. The method according to claim 15 wherein:

said image has an M×N resolution in said frequency-encoded and said phase-encoded dimension, respectively;

there are k of said receiver coils;

each of said time domain signals has at least M time samples;

the acquired data set includes k sets of f simultaneously generated time domain signals, with each of the f signals of a given one of the k sets being generated by a different one of the k receiver coil for a corresponding one of f different phase-shift gradient values along said phase-encoded dimension;

wherein f is less than N; and wherein a sensitivity profile enables complex values determined by the one-dimensional Fourier Transform of time domain signals from different receiver coils for a given location along the frequency-encoded dimension to be used together in solving said system of equations for the given location so as to generate a portion of the generated image corresponding to the given location along the frequency-encoded dimension.

17. The method according to claim 16 wherein k×f is equal to or greater than N, the image resolution in the phase-encoded dimension.

18. The method according to claim 14 wherein:

said image is a two dimensional image in a plane defined by said frequency-encoded dimension and said phase-encoded dimension; and the solving of the system of equations defined by the NMR information derived by one dimensional Fourier transform of multiple time domain signals for a given location along the frequency-encoded dimension results in the generation of one line of the two dimensional image for that given location along the frequency-encoded dimension, which line represents the intensity of NMR at each of successive different location along the phase-encoded dimension.

19. An apparatus for generating a nuclear magnetic resonance (NMR) image of an object of interest comprising:

a magnetic resonance imaging device comprising a magnet system providing a homogeneous magnetic background field in an imaging volume, at least one programmed processor, memory, a RF body coil surrounding said imaging volume, and a plurality of radio frequency receiver coils defining a multi-dimensional array thereof disposed about said imaging volume;

wherein said magnetic resonance imaging device is adapted to acquire a data set comprised of a plurality of NMR time domain signals, each of which is induced into one or more receiver coils by the NMR of different nuclei at different locations throughout an image generating volume in the object of interest, wherein the component of each such signal that comes from NMR at a given location in said image generating volume is:

encoded along a frequency-encoded dimension by position dependent frequency shifts induced by a magnetic field gradient along said frequency encoded dimension; and encoded along at least one other, phase-encoded, dimension by a set of one or more position dependent phase shifts induced by one or more different magnetic field gradient along said phase-encoded dimension;

wherein said central processor is adapted to:

use a one dimensional Fourier Transform along the frequency-encoded dimension on the NMR time domain signals of said acquired data set to separate information contained in each such time domain signal into separate portions corresponding to information derived from the NMR of nuclei from a regions in said image generating volume at a given location along said frequency-encoded dimension;

separately solve for each given one of a succession of locations along the frequency-encoded dimension, a system of equations defined by the NMR information derived by said one dimensional Fourier Transformation from each of a plurality of said NMR time domain signals for the given location along said frequency-encoded dimension, so as to generate a portion of the generated image corresponding to the given location along the frequency-encoded dimension.

20. The apparatus of claim 19 wherein:

said magnetic resonance imaging device is adapted to acquire different ones of said time-domain signals with different phase-shift gradients along said phase-encoded dimension;

the one dimensional Fourier Transform performed by the processor on each time domain signal determines a complex value at each of a plurality of frequency, each of which frequencies corresponds to one of said successive locations along the frequency-encoded dimension; and the solving by the processor of a system of equations for each given location along the frequency-encoded dimension includes using the complex value determined for the given location by the one dimensional Fourier Transform of each different time domain signal.

21. The apparatus of claim 20 wherein:

said image has an M×N resolution in said frequency-encoded and said phase-encoded dimension, respectively;

there are k of said receiver coils;

each of said time domain signals has at least M time samples;

the acquired data set includes k sets of f simultaneously generated time domain signals, with each of the f signals of a given one of the k sets being generated by a different one of the k receiver coil for a corresponding one of f different phase-shift gradient values along said phase-encoded dimension;

wherein f is less than N; and wherein a sensitivity profile enables complex values determined by the one-dimensional Fourier Transform of time domain signals from different receiver coils for a given location along the frequency-encoded dimension to be used together in solving said system of equations for the given location so as to generate a portion of the generated image corresponding to the given location along the frequency-encoded dimension.

22. The apparatus of claim 21 wherein k×f is equal to or greater than N, the image resolution in the phase-encoded dimension.

23. The apparatus of claim 19 wherein:

said image is a two dimensional image in a plane defined by said frequency-encoded dimension and said phase-encoded dimension; and the solving by the processor of the system of equations defined by the NMR information derived by one dimensional Fourier transform of multiple time domain signals for a given location along the frequency-encoded dimension results in the generation of one line of the two dimensional image for that given location along the frequency-encoded dimension, which line represents the intensity of NMR at each of successive different location along the phase-encoded dimension.

* * * * *